United States Patent

Kurokami et al.

[11] Patent Number: 5,955,885
[45] Date of Patent: *Sep. 21, 1999

[54] BATTERY POWER SUPPLY DEVICE CHARACTERISTIC MEASURING APPARATUS AND MEASURING METHOD

[75] Inventors: Seiji Kurokami, Tsuzuki-gun; Kimitoshi Fukae, Nara; Nobuyoshi Takehara, Soraku-gun, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/685,540

[22] Filed: Jul. 24, 1996

[30] Foreign Application Priority Data

Jul. 26, 1995 [JP] Japan .................. 7-209359

[51] Int. Cl.⁶ .................................. G01N 27/416
[52] U.S. Cl. .................... 324/426; 136/243; 324/767
[58] Field of Search ..................... 324/426, 767, 324/404; 330/2; 371/20; 136/244, 243

[56] References Cited

U.S. PATENT DOCUMENTS

| | | | |
|---|---|---|---|
| 3,630,627 | 12/1971 | Low | 356/222 |
| 3,708,669 | 1/1973 | Work | 250/205 |
| 4,081,743 | 3/1978 | Madden | 324/29.5 |
| 4,184,111 | 1/1980 | Lovelace | 324/404 |
| 4,450,411 | 5/1984 | Spurr | 330/2 |
| 4,736,374 | 4/1988 | Kump | 371/20 |
| 5,389,158 | 2/1995 | Fraas | 136/244 |
| 5,572,136 | 11/1996 | Champlin | 324/426 |
| 5,648,731 | 7/1997 | Decker | 324/767 |

FOREIGN PATENT DOCUMENTS 93 12 710  12/1993  Germany .
1-109271   4/1989   Japan .

OTHER PUBLICATIONS

Lashway, Clin, "Photovoltaic System Testing Techniques and Results", *IEEE Transactions on Energy Conversion*, vol. 3, No. 3, Dec. 1988, pp. 503–506.

*Primary Examiner*—Josie Ballato
*Assistant Examiner*—Thomas Valone
*Attorney, Agent, or Firm*—Fitzpatrick, Cella, Harper & Scinto

[57] ABSTRACT

In order to accurately and stably measure the output characteristics of a battery power supply device, especially, a large-scale solar cell module by an equipment that requires only a size and cost equivalent to those of an apparatus used for measuring a small-scale module, the light-receiving surface of the solar cell module is divided into areas each including a bypass diode, the output characteristics upon light illumination in units of divided areas are measured, the measured characteristics are synthesized, and the influence of bypass diode characteristics is subtracted from the synthesized characteristics, thereby calculating the output characteristics of the solar cell module.

6 Claims, 5 Drawing Sheets

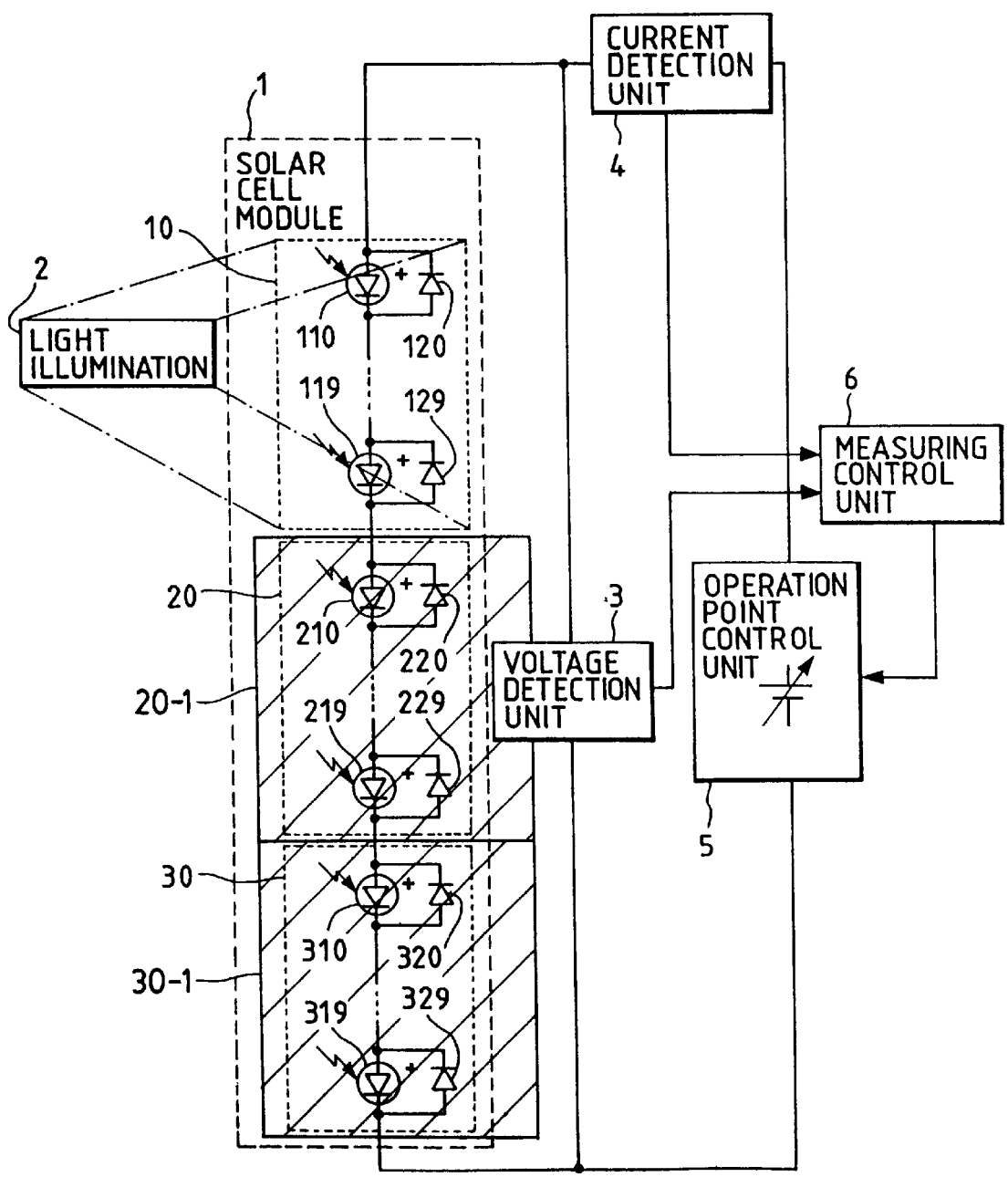

BATTERY POWER SUPPLY DEVICE CHARACTERISTIC MEASURING APPARATUS AND MEASURING METHOD

BACKGROUND OF THE INVENTION

1. Field of the Invention

The present invention relates to a battery power supply device characteristic measuring apparatus and a measuring method and, more particularly, to a battery power supply device characteristic measuring apparatus for measuring-the voltage current output characteristics of a battery power supply device using a battery power supply such as a solar cell, and a measuring method.

2. Related Background Art

Due to recent strong concern about the global environment, power supply systems such as a sunlight power generation system, a wind-force power generation system, and the like are considered promising as clean energy sources. Upon constituting a sunlight power generation system, a solar cell array is constructed by recognizing the characteristics of solar cell modules and determining serial/parallel connections of solar cell modules so as to obtain a desired output and voltage.

In order to recognize the characteristics of each solar cell module, in a conventional method of measuring the voltage-current output characteristics of a solar cell, outdoor light or solar simulator light illuminates the entire light-receiving surface of a solar cell, and measurements based on an electron load method, a capacitor load method, a bias power supply method, or the like are performed. In these methods, the operation point of the solar cell illuminated by light is changed continuously or stepwise from the short-circuiting state to the open state or vice versa, and the operation point voltages and currents are sampled to measure the voltage current output characteristics.

However, the above-mentioned method has the following problems.

More specifically, in the measurement of the voltage-current output characteristics of a large-scale solar cell module, when solar simulator light is used as illumination light, a solar simulator that can uniformly illuminate the entire light-receiving surface of the large-scale solar cell module is required. However, such solar simulator is a very large-scale equipment, requires a very large setting place and power supply capacity, and is very expensive. Also, when the large-scale solar cell module has a special shape, e.g., an extremely elongated shape, an existing solar simulator cannot cope with such module.

On the other hand, when outdoor light is utilized as illumination light, it can uniformly illuminate the entire surface of the large-scale solar cell module. However, since the illumination intensity, spectrum, and the like of the outdoor light are strongly influenced by the weather, time, and season at the time of measurement, constant measurement conditions cannot always be obtained.

SUMMARY OF THE INVENTION

It is an object of the present invention to provide an apparatus and method for accurately and stably measuring the output characteristics of a battery power supply device, especially, a large-scale solar cell module by an equipment that requires only a size and cost equivalent to those of an apparatus used for measuring a small-scale module.

It is another object of the present invention to provide a battery power supply device output characteristic measuring apparatus comprising: voltage detection means for detecting an output voltage from a battery power supply device in which a plurality of power supply units each constituted by a battery power supply and a diode connected in inverse-parallel with the power supply battery are connected in series with each other; current detection means for detecting an output current from the battery power supply device; operation point control means, connected to an output terminal of the battery power supply device, for changing an operation point of the battery power supply device upon measuring output characteristics thereof; means for dividing the battery power supply device into a plurality of portions each including at least one power supply unit, and measuring the output characteristics of the battery power supply device in units of divided portions in a state wherein the battery power supply in one portion is enabled, and the battery power supplies in other portions are disabled; means for calculating output characteristics of the individual divided portions by synthesizing characteristics of the diodes energized upon measuring the output characteristics in units of divided portions; and means for calculating output characteristics of the entire battery power supply device by synthesizing the output characteristics calculated in units of divided portions.

It is still another object of the present invention to provide a battery power supply device output characteristic measuring apparatus comprising: voltage detection means for detecting an output voltage from a battery power supply device in which a plurality of power supply units each constituted by a battery power supply and a diode connected in inverse-parallel with the power supply battery are connected in series with each other; current detection means for detecting an output current from the battery power supply device; operation point control means, connected to an output terminal of the battery power supply device, for changing an operation point of the battery power supply device upon measuring output characteristics thereof; means for dividing the battery power supply device into a plurality of portions each including at least one power supply unit, and measuring the output characteristics of the battery power supply device in units of divided portions in a state wherein the battery power supply in one portion is enabled, and the battery power supplies in other portions are disabled; means for synthesizing the measured output characteristics in units of divided portions; and means for calculating output characteristics of the entire battery power supply device by synthesizing the synthesized output characteristics and diode characteristics for a total number of diodes energized upon measuring.

It is still another object of the present invention to provide a battery power supply device output characteristic measuring apparatus comprising: voltage detection means for detecting an output voltage from a battery power supply device in which a plurality of power supply units each constituted by a battery power supply and a diode connected in inverse-parallel with the power supply battery are connected in series with each other; current detection means for detecting an output current from the battery power supply device; operation point control means, connected to an output terminal of the battery power supply device, for changing an operation point of the battery power supply device upon measuring output characteristics thereof; means for dividing the battery power supply device into n (n≧2) portions each including at least one power supply unit, and measuring the output characteristics of the battery power supply device in units of divided portions in a state wherein the battery power supply in one portion is enabled, and the battery power supplies in other (n−1) portions are disabled; means for measuring output characteristics of the battery power supply device in a state wherein all the battery power supplies are disabled; and means for calculating output characteristics of the entire battery power supply device by synthesizing n output characteristics measured in units of divided portions and output characteristics corresponding to the (n−1) portions measured in the disabled state.

It is still another object of the present invention to provide a battery power supply output characteristic measuring apparatus comprising: voltage detection means for detecting an output voltage from a solar cell in which m (m≧2) parallel blocks each including a photoelectric conversion element and a bypass diode connected in inverse-parallel to the photoelectric conversion element are connected in series with each other; current detection means for detecting an output current from the solar cell; operation point control means, connected to an output terminal of the solar cell, for changing an operation point of the solar cell upon measuring output characteristics of the solar cell; light illumination means for illuminating the photoelectric conversion element in a portion of the solar cell upon measuring the output characteristics; means for dividing the solar cell into n (2≦n≦m) areas each including at least one parallel block, and measuring output characteristics of the solar cell in units of areas by illuminating the photoelectric conversion element in one area by the light illumination means and shielding the photoelectric conversion elements in other (n−1) areas from light; means for calculating output characteristics of the individual areas by synthesizing characteristics of the bypass diodes energized upon measuring the output characteristics in units of areas; and means for calculating output characteristics of the entire solar cell by synthesizing the output characteristics of the individual areas calculated in units of areas.

It is still another object of the present invention to provide a battery power supply output characteristic measuring apparatus comprising: voltage detection means for detecting an output voltage from a solar cell in which m (m≧2) parallel blocks each including a photoelectric conversion element and a bypass diode connected in inverse-parallel to the photoelectric conversion element are connected in series with each other; current detection means for detecting an output current from the solar cell; operation point control means, connected to an output terminal of the solar cell, for changing an operation point of the solar cell upon measuring output characteristics of the solar cell; light illumination means for illuminating the photoelectric conversion element in a portion of the solar cell upon measuring the output characteristics; means for dividing the solar cell into n (2≦n≦m) areas each including at least one parallel block, and measuring output characteristics of the solar cell in units of areas by illuminating the photoelectric conversion element in one area by the light illumination means and shielding the photoelectric conversion elements in other (n−1) areas from light; means for synthesizing the output characteristics in units of areas; and means for calculating output characteristics of the entire solar cell by synthesizing the synthesized output characteristics and diode characteristics for a total number of bypass diodes energized upon measuring.

It is still another object of the present invention to provide a battery power supply output characteristic measuring apparatus comprising: voltage detection means for detecting an output voltage from a solar cell in which m (m≧2) parallel blocks each including a photoelectric conversion element and a bypass diode connected in inverse-parallel to the photoelectric conversion element are connected in series with each other; current detection means for detecting an output current from the solar cell; operation point control means, connected to an output terminal of the solar cell, for changing an operation point of the solar cell upon measuring output characteristics of the solar cell; light illumination means for illuminating the photoelectric conversion element in a portion of the solar cell upon measuring the output characteristics; means for dividing the solar cell into n (2≦n≦m) areas each including at least one parallel block, and measuring output characteristics of the solar cell in units of areas by illuminating the photoelectric conversion element in one area by the light illumination means and shielding the photoelectric conversion elements in other (n−1) areas from light; means for measuring output characteristics of the solar cell by shielding all the photoelectric conversion elements from light; and means for calculating output characteristics of the entire solar cell by synthesizing n output characteristics measured in units of areas and output characteristics corresponding to the (n−1) portions measured when all the photoelectric conversion elements are shielded from light.

It is still another object of the present invention to provide a battery power supply device output characteristic measuring method for measuring output characteristics of a battery power supply device, in which a plurality of power supply units each constituted by a battery power supply and a diode connected in inverse-parallel with the power supply battery are connected in series with each other, using voltage detection means for detecting an output voltage from the battery power supply device, output current detection means for detecting an output current from the battery power supply device, and operation point control means, connected to an output terminal of the battery power supply device, for changing an operation point of the battery power supply device, comprising the steps of: dividing the battery power supply device into a plurality of portions each including at least one power supply unit, and measuring output characteristics of the battery power supply device in units of divided portions in a state wherein the battery power supply in one portion is enabled, and the battery power supplies in other portions are disabled; calculating output characteristics of the individual divided portions by synthesizing characteristics of the diodes energized upon measuring the output characteristics in units of divided portions; and calculating output characteristics of the entire battery power supply device by synthesizing the output characteristics calculated in units of divided portions.

It is still another object of the present invention to provide a battery power supply device output characteristic measuring method for measuring output characteristics of a battery power supply device, in which a plurality of power supply units each constituted by a battery power supply and a diode connected in inverse-parallel with the power supply battery are connected in series with each other, using voltage detection means for detecting an output voltage from the battery power supply device, output current detection means for detecting an output current from the battery power supply device, and operation point control means, connected to an output terminal of the battery power supply device, for changing an operation point of the battery power supply device, comprising the steps of: dividing the battery power supply device into a plurality of portions each including at least one power supply unit, and measuring output characteristics of the battery power supply device in units of divided portions in a state wherein the battery power supply in one portion is enabled, and the battery power supplies in other portions are disabled; synthesizing the measured output characteristics in units of divided portions; and calculating output characteristics of the entire battery power supply device by synthesizing the synthesized output characteristics and diode characteristics for a total number of diodes energized upon measuring.

It is still another object of the present invention to provide a battery power supply device output characteristic measuring method for measuring output characteristics of a battery power supply device, in which a plurality of power supply units each constituted by a battery power supply and a diode connected in inverse-parallel with the power supply battery are connected in series with each other, using voltage detection means for detecting an output voltage from the battery power supply device, output current detection means for detecting an output current from the battery power supply device, and operation point control means, connected to an output terminal of the battery power supply device, for changing an operation point of the battery power supply device, comprising the steps of: dividing the battery power supply device into n (n≧2) portions each including at least one power supply unit, and measuring output characteristics of the battery power supply device in units of divided portions in a state wherein the battery power supply in one portion is enabled, and the battery power supplies in other (n−1) portions are disabled; measuring output characteristics of the battery power supply device in a state wherein all the battery power supplies are disabled; and calculating output characteristics of the entire battery power supply device by synthesizing n output characteristics measured in units of divided portions and output characteristics corresponding to the (n−1) portions measured in the disabled state.

It is still another object of the present invention to provide a battery power supply output characteristic measuring method for measuring output characteristics of a solar cell, in which m (m≧2) parallel blocks each including a photoelectric conversion element and a bypass diode connected in inverse-parallel to the photoelectric conversion element are connected in series with each other, using light illumination means, voltage detection means for detecting an output voltage from the solar cell, output current detection means for detecting an output current from the solar cell, and operation point control means, connected to an output terminal of the solar cell, for changing an operation point of the solar cell, comprising the steps of: dividing the solar cell into n (2≦n≦m) areas each including at least one parallel block, and measuring output characteristics of the solar cell in units of areas by illuminating the photoelectric conversion element in one area and shielding the photoelectric conversion elements in other (n−1) areas from light; calculating output characteristics of the individual areas by synthesizing characteristics of the bypass diodes energized upon measuring the output characteristics in units of areas; and calculating output characteristics of the entire solar cell by synthesizing the output characteristics of the individual areas calculated in units of areas.

It is still another object of the present invention to provide a battery power supply output characteristic measuring method for measuring output characteristics of a solar cell, in which m (m≧2) parallel blocks each including a photoelectric conversion element and a bypass diode connected in inverse-parallel to the photoelectric conversion element are connected in series with each other, using light illumination means, voltage detection means for detecting an output voltage from the solar cell, output current detection means for detecting an output current from the solar cell, and operation point control means, connected to an output terminal of the solar cell, for changing an operation point of the solar cell, comprising the steps of: dividing the solar cell into n (2≦n≦m) areas each including at least one parallel block, and measuring output characteristics of the solar cell in units of areas by illuminating the photoelectric conversion element in one area and shielding the photoelectric conversion elements in other (n−1) areas from light; synthesizing the output characteristics in units of areas; and calculating output characteristics of the entire solar cell by synthesizing the synthesized output characteristics and diode characteristics for a total number of bypass diodes energized upon measuring.

It is still another object of the present invention to provide a battery power supply output characteristic measuring method for measuring output characteristics of a solar cell, in which m (m≧2) parallel blocks each including a photoelectric conversion element and a bypass diode connected in inverse-parallel to the photoelectric conversion element are connected in series with each other, using light illumination means, voltage detection means for detecting an output voltage from the solar cell, output current detection means for detecting an output current from the solar cell, and operation point control means, connected to an output terminal of the solar cell, for changing an operation point of the solar cell, comprising the steps of: dividing the solar cell into n (2≦n≦m) areas each including at least one parallel block, and measuring output characteristics of the solar cell in units of areas by illuminating the photoelectric conversion element in one area and shielding the photoelectric conversion elements in other (n−1) areas from light; measuring output characteristics of the solar cell by shielding all the photoelectric conversion elements from light; and calculating output characteristics of the entire solar cell by synthesizing n output characteristics measured in units of areas and output characteristics corresponding to the (n−1) portions measured when all the photoelectric conversion elements are shielded from light.

It is still another object of the present invention to provide a battery power supply measuring method comprising the steps of:

detecting output characteristics of a battery power supply device, having a plurality of series blocks each having a battery power supply and a diode connected in inverse-parallel to the battery power supply, in units of series blocks; and synthesizing the detected output characteristics and characteristics of the diodes.

It is still another object of the present invention to provide a characteristic measuring apparatus for a battery power supply device, having a plurality of series blocks each having a battery power supply and a diode connected in inverse-parallel to the battery power supply, comprising:

means for measuring output characteristics of a required one of the series blocks; and means for synthesizing characteristics of the diodes and the output characteristics measured by the means for measuring the output characteristics.

The above objects are achieved by, for example, a solar cell output characteristic measuring apparatus which has a solar cell constituted by equivalently connecting, in series with each other, m (m≧2) parallel blocks each consisting of a photoelectric conversion element and a bypass diode connected in inverse-parallel with the photoelectric conversion element, a light illumination unit, an output voltage detection unit for the solar cell, an output current detection unit for the solar cell, an operation point control unit which is connected to the output terminal of the solar cell and varies the operation point of the solar cell, and a measuring control unit, wherein (1) the solar cell is divided into n ($2 \leq n \leq m$) areas each including at least one parallel block, and the output characteristics of the solar cell are measured in units of areas while only the photoelectric conversion element in one area is illuminated by light and the photoelectric conversion elements in other (n−1) areas are shielded from light, (2) output characteristics for each area are calculated by synthesizing the bypass diode characteristics of the bypass diodes energized upon measuring the output characteristics in units of areas, and (3) the output characteristics of the entire solar cell are calculated by synthesizing the output characteristics for each area, which are calculated in units of areas.

Also, the above objects are achieved by a solar cell output characteristic measuring apparatus which has a solar cell constituted by connecting, in series with each other, m ($m \geq 2$) parallel blocks each consisting of a photoelectric conversion element and a bypass diode connected in inverse-parallel with the photoelectric conversion element, a light illumination unit, an output voltage detection unit for the solar cell, an output current detection unit for the solar cell, an operation point control unit which is connected to the output terminal of the solar cell and varies the operation point of the solar cell, and a measuring control unit, wherein (1) the solar cell is divided into n ($2 \leq n \leq m$) areas each including at least one parallel block, and the output characteristics of the solar cell are measured in units of areas while only the photoelectric conversion element in one area is illuminated by light and the photoelectric conversion elements in other (n−1) areas are shielded from light, (2) the output characteristics in units of areas are synthesized, and (3) the synthesized output characteristics and diode characteristics for a total number of bypass diodes energized upon measuring are synthesized to calculate the output characteristics of the entire solar cell.

Furthermore, the above objects are achieved by a solar cell output characteristic measuring apparatus which has a solar cell constituted by connecting, in series with each other, m ($m \geq 2$) parallel blocks each consisting of a photoelectric conversion element and a bypass diode connected in inverse-parallel with the photoelectric conversion element, a light illumination unit, an output voltage detection unit for the solar cell, an output current detection unit for the solar cell, an operation point control unit which is connected to the output terminal of the solar cell and varies the operation point of the solar cell, and a measuring control unit, wherein (1) the solar cell is divided into n ($2 \leq n \leq m$) areas each including at least one parallel block, and the output characteristics of the solar cell are measured in units of areas while only the photoelectric conversion element in one area is illuminated by light and the photoelectric conversion elements in other (n−1) areas are shielded from light, (2) the output characteristics of the solar cell are measured by shielding all the photoelectric conversion elements from light, and (3) the n output characteristics measured in units of areas and (n−1) output characteristics measured in the light-shielded state of all the photoelectric conversion elements are synthesized to calculate the output characteristics of the entire solar cell.

Note that the present invention can be applied not only to a solar cell using a photoelectric conversion element but also to a battery power supply device using a battery power supply such as a photoelectric conversion element.

In the present invention, when a solar cell or the like is divided into a plurality of areas, and the output characteristics of the solar cell are measured while only one area is illuminated by light and other areas are shielded from light, output characteristics for one area including a voltage drop component across a bypass diode can be obtained. When other areas are similarly measured, output characteristics including voltage drop components across bypass diodes in these areas are obtained.

The characteristics of the bypass diodes used are checked in advance, and are stored in, e.g., a storage device. Thus, the influence of the bypass diodes can be subtracted from the output characteristics including the voltage drop components across the bypass diodes in units of areas by synthesizing the stored output characteristics of the bypass diodes, thus calculating the output characteristics in units of areas. Thereafter, the output characteristics of the entire solar cell can be calculated by adding the output characteristics in units of areas to each other.

Alternatively, the calculation processes may be reversed in order. That is, the output characteristics including the voltage drop components across the bypass diodes in units of areas are added to each other, and the influence of the total number of bypass diodes energized is subtracted therefrom, thereby calculating the output characteristics of the entire solar cell while simplifying the calculation processes.

On the other hand, when the characteristics of the solar cell are measured by shielding the entire surface of the solar cell from light, the characteristics of a series circuit of the bypass diodes used are obtained. When the solar cell is divided into n areas and the characteristics are measured in units of areas, each bypass diode is consequently energized (n−1) times. For this reason, the output characteristics of the entire solar cell can be calculated by subtracting the characteristics of a series circuit of (n−1) bypass diodes from the sum of the output characteristics including voltage drop components across the bypass diodes in units of areas in accordance with actually measured values. In this case, the number of calculation processes is small, and since the bypass diode characteristics are subtracted in accordance with the actually measured values, the influence of variations of the bypass diode characteristics can also be eliminated.

BRIEF DESCRIPTION OF THE DRAWINGS

FIG. 1 is a schematic block diagram for explaining a preferred example of the arrangement of a solar cell output characteristic measuring system according to the present invention;

DETAILED DESCRIPTION OF THE PREFERRED EMBODIMENTS

Figure 2A:
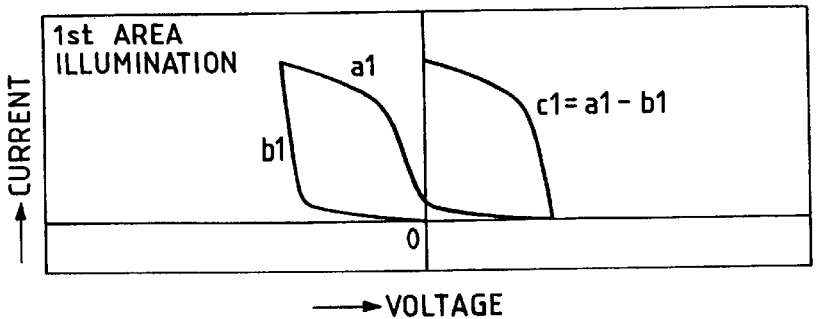
FIGS. 2, 3, and 5 are respectively charts for explaining preferred examples of an output characteristic measuring method according to the present invention.
Figure 2B:
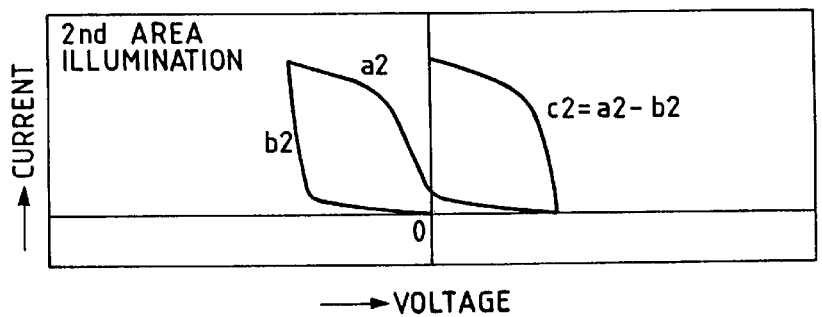
Figure 2C:
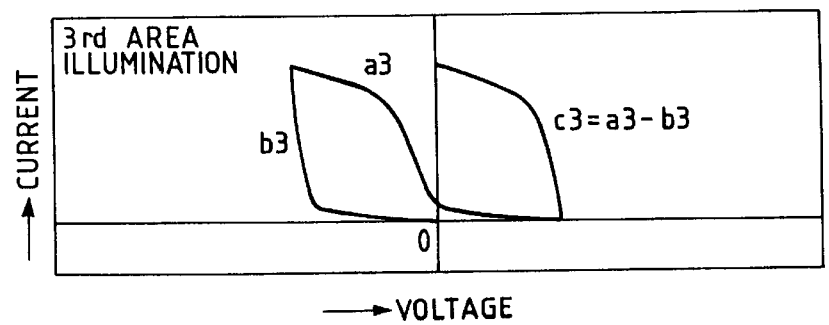
Figure 2D:
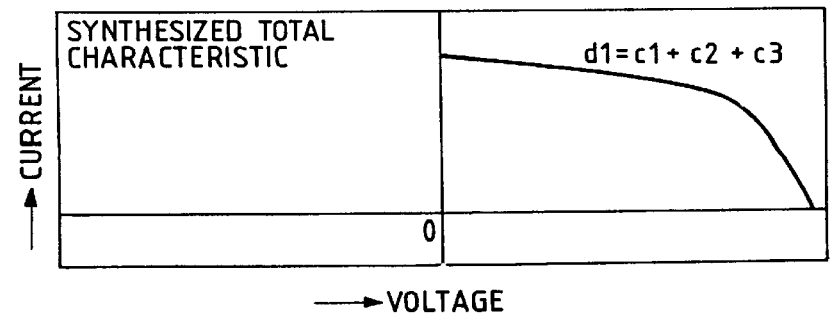
Figure 3A:
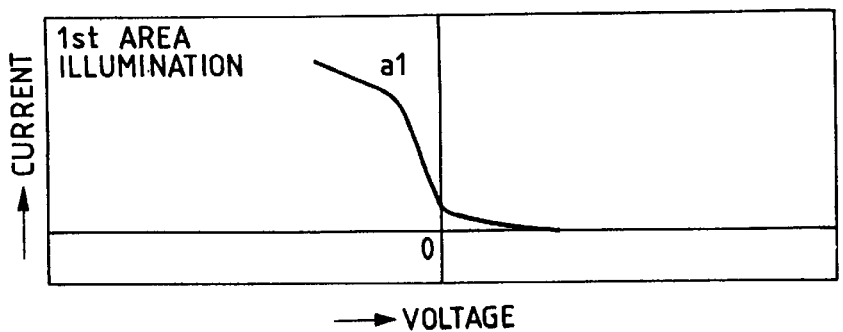
Figure 3B:
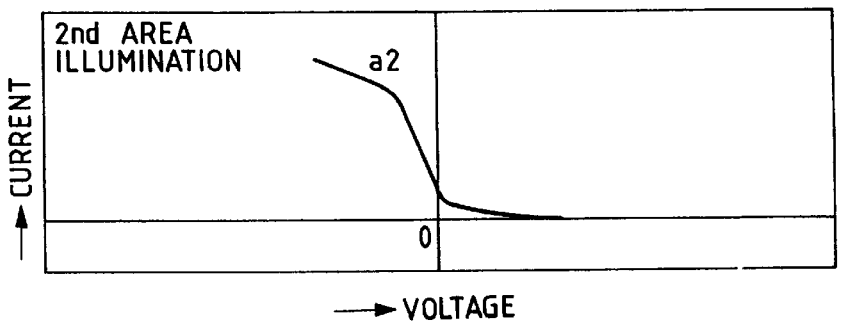
Figure 3C:
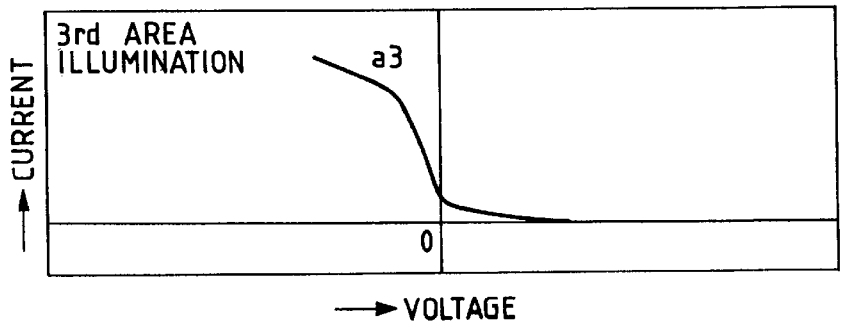
Figure 3D:
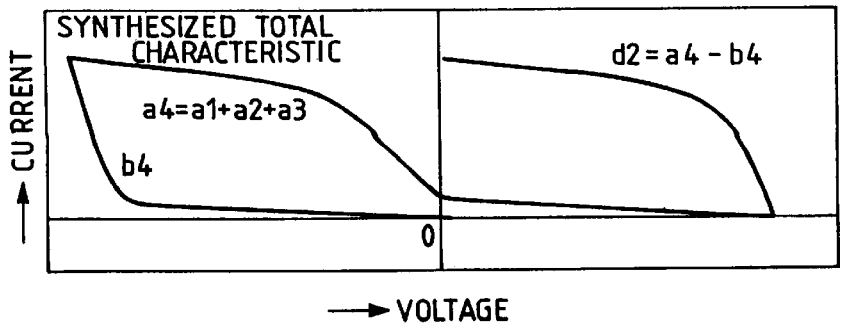

The preferred embodiments of the present invention will be described below with reference to the accompanying drawings.

First Embodiment

FIG. 1 shows the arrangement of a solar cell output characteristic measuring system according to an embodiment of the present invention. Referring to FIG. 1, a solar cell module 1 is constituted on the basis of parallel blocks each of which consists of a pair of a photoelectric conversion element including a photovoltaic element such as a solar cell element, and a bypass diode connected in inverse-parallel with the photoelectric conversion element (i.e., connected in parallel with the photoelectric conversion element in a direction opposite to the direction of a current that flows in the photoelectric conversion element). That is, the solar cell module 1 is constituted by connecting, in series with each other, a series block 10 including parallel blocks from a parallel block consisting of a photoelectric conversion element 110 and a bypass diode 120 to a parallel block consisting of a photoelectric conversion element 119 and a bypass diode 129, a series block 20 including parallel blocks from a parallel block consisting of a photoelectric conversion element 210 and a bypass diode 220 to a parallel block consisting of a photoelectric conversion element 219 and a bypass diode 229, and a series block 30 including parallel blocks from a parallel block consisting of a photoelectric conversion element 310 and a bypass diode 320 to a parallel block consisting of a photoelectric conversion element 319 and a bypass diode 329. As the material of the photoelectric conversion elements, various materials such as amorphous silicon, polycrystalline silicon, monocrystalline silicon, and semiconductor components are available. The bypass diode is selected to satisfy requirements as to the reverse voltage and the current capacity in correspondence with the photoelectric conversion element used.

The output from the solar cell module 1 is connected to an operation point control unit 5, which changes the operation point of the solar cell module 1. Upon changing the operation point, the solar cell module 1 can be changed from the open state to the short-circuiting state or vice versa. Also, the operation point of the solar cell module 1 can be swept continuously or varied stepwise. The operation point control unit 5 may comprise a bipolar power supply, a power amplifier, a capacitor load, or the like.

The solar cell module 1 is exposed by a light illumination unit 2. Illumination light preferably uniformly expose the entire illumination surface, and a variation in illumination light in each illumination is preferably as small as possible. As a light source of the light illumination means, a xenon lamp or the like may be used. The output characteristics of the solar cell have dependence on the spectral distribution, and the light emission spectrum of the light source should be carefully selected. Normally, whole-sky sunlight of AM1.5 and 1 kW/m$^2$ is used as reference light.

The output voltage and output current from the solar cell module 1 are respectively detected by a voltage detection unit 3 and a current detection unit 4, and the detected values are input to a measuring control unit 6. The voltage detection unit 3 voltage-divides the output terminal voltage from the solar cell module 1 by a resistor, A/D-converts the voltage-divided value into a digital value, and supplies the digital value to the measuring control unit 6. The current detection unit 4 converts the input current into a desired voltage value using a Hall sensor, a combination of a current detection resistor and an amplifier for amplifying a very small signal, or the like, A/D-converts the voltage signal into a digital value, and supplies the digital value to the measuring control unit 6 as in the voltage detection unit 3.

The measuring control unit 6 controls the operation point control unit 5 to set a desired operation point of the solar cell module 1, receives and stores the voltage and current detection values as digital values, and calculates the output characteristics of the solar cell module 1 by performing predetermined arithmetic operations. The measuring control unit 6 is realized by a control microcomputer comprising, e.g., a CPU, a RAM, a ROM, a PIO, and the like. The calculated output characteristics are output as data by connecting a display, a printer, or an external storage device such as a floppy disk, a hard disk, a magnetooptical disk, or the like, to the measuring control unit 6, as needed. The characteristics of the bypass diodes used in the solar cell module 1 are stored in a ROM or an external storage device, and are used upon calculation of the output characteristics of the solar cell module 1.

The method of measuring the output characteristics of the solar cell in the apparatus shown in FIG. 1 will be described below. Referring to FIG. 1, the solar cell module 1 is divided into three areas. In this case, the series block 10 obtained by connecting 10 parallel blocks from the parallel block consisting of the photoelectric conversion element 110 and the bypass diode 120 to the parallel block consisting of the photoelectric conversion element 119 and the bypass diode 129 will be referred to as a first area hereinafter, the series block 20 having 10 parallel blocks from the parallel block consisting of the photoelectric conversion element 210 and the bypass diode 220 to the parallel block consisting of the photoelectric conversion element 219 and the bypass diode 229 will be referred to as a second area hereinafter, and the series block 30 having 10 parallel blocks from the parallel block consisting of the photoelectric conversion element 310 and the bypass diode 320 to the parallel block consisting of the photoelectric conversion element 319 and the bypass diode 329 will be referred to as a third area hereinafter. Note that the number of divided areas of the solar cell module should be appropriately determined in correspondence with the size and exposure range of the solar cell module 1.

The solar cell module 1 is set, so that the second and third areas (20 and 30) are completely shielded from light, by shields 20-1 and 30-1 which preferably are covers of non-light transmitting cloth; and only the first area (10) is exposed. Light illuminates only the first area (10), the voltage and current at the output terminal of the solar cell module 1 are controlled by the operation point control unit 5, and the voltage and current values at the respective operation points are detected by the voltage detection unit 3 and the current detection unit 4. In this case, as for an open voltage Voc, the voltage is directly observed as a positive value, but as for a short-circuiting current Isc, the voltage at the output terminal of the solar cell module 1 assumes a negative value due to the voltage drops across the bypass diodes in the second and third areas (20 and 30). For this reason, the operation point control unit 5 must be appropriately controlled. In this case, an approximate value of the short-circuiting current Isc can be determined based on the type and size of the photoelectric conversion element used in the solar cell module 1, and this value may be used. Alternatively, since the characteristics of the diodes used are known, a value corresponding to the diode characteristics may be subtracted from measured data. In this manner, the operation point control unit 5 can be controlled appropriately. This measured data is indicated by a1 in FIG. 2.

The obtained data a1 having information associated with the output characteristics of the first area (10) includes voltage drop components across the bypass diodes in the second and third areas (20 and 30) as non-illumination areas. Therefore, if the influence of the bypass diodes can be subtracted from the obtained data, the output characteristics of the first area (10) can be obtained.

On the other hand, since the characteristics of the individual bypass diodes are known, the total characteristics of the bypass diodes in the non-illumination areas can be obtained by calculating the synthesized value of the stored characteristics of the individual bypass diodes. The obtained characteristics are indicated by b1 in FIG. 2.

More specifically, in the first area (10), by subtracting the synthesized characteristics b1 of the bypass diodes energized upon measuring from the measured data a1, the output characteristics of only the first area (10) are calculated. The calculated output characteristics are indicated by c1 in FIG. 2. In this manner, the output characteristics of the first area (10) are obtained.

Subsequently, the solar cell module 1 is set, so that the first and third areas (10 and 30) are completely shielded from light, and only the second area (20) is exposed. Light illuminates only the second area (20), the voltage and current at the output terminal of the solar cell module 1 are controlled by the operation point control unit 5, and the voltage and current values at the respective operation points are detected by the voltage detection unit 3 and the current detection unit 4. This measured data is indicated a2 in FIG. 2.

The obtained data a2 having information associated with the output characteristics of the second area (20) includes voltage drop components across the bypass diodes in the non-illumination areas. Therefore, if the influence of the bypass diodes can be subtracted from the obtained data, the output characteristics of the second area (20) can be obtained.

On the other hand, since the characteristics of the individual bypass diodes are known, the total characteristics of the bypass diodes in the non-illumination areas can be obtained by calculating the synthesized value of the stored characteristics of the individual bypass diodes. The obtained characteristics are indicated by b2 in FIG. 2.

More specifically, in the second area (20), by subtracting the synthesized characteristics b2 of the bypass diodes energized upon measuring from the measured data a2, the output characteristics of only the second area (20) are calculated. The calculated output characteristics are indicated by c2 in FIG. 2. In this manner, the output characteristics of the second area (20) are obtained.

Likewise, the solar cell module 1 is set, so that the first and second areas (10 and 20) are completely shielded from light, and only the third area (30) is exposed. Light illuminates only the third area (30), the voltage and current at the output terminal of the solar cell module 1 are controlled by the operation point control unit 5, and the voltage and current values at the respective operation points are detected by the voltage detection unit 3 and the current detection unit 4. This measured data is indicated a3 in FIG. 2.

The obtained data a3 having information associated with the output characteristics of the third area (30) includes voltage drop components across the bypass diodes in the non-illumination areas. Therefore, if the influence of the bypass diodes can be subtracted from the obtained data, the output characteristics of the third area (30) can be obtained.

On the other hand, since the characteristics of the individual bypass diodes are known, the total characteristics of the bypass diodes in the non-illumination areas can be obtained by calculating the synthesized value of the stored characteristics of the individual bypass diodes. The obtained characteristics are indicated by b3 in FIG. 2.

More specifically, in the third area (30), by subtracting the synthesized characteristics b3 of the bypass diodes energized upon measuring from the measured data a3, the output characteristics of only the third area (30) are calculated. The calculated output characteristics are indicated by c3 in FIG. 2. In this manner, the output characteristics of the third area (30) are obtained.

In this manner, light illumination is performed in units of areas to obtain the measured data in units of areas. In the solar cell module 1, since the photoelectric conversion elements to be illuminated with light and the bypass diodes to be energized are connected in series with each other, the output characteristics in units of areas can be calculated by subtracting a sum total of voltage values, each at an identical current value, of the bypass diodes energized upon measuring from the voltage value of the measured data.

The calculated output characteristics in units of areas are synthesized. That is, since the first, second, and third areas (10, 20, and 30) are connected in series with each other, the voltage values, each at an identical current value, of these areas in the output characteristics c1, c2, and c3 of the first, second, and third areas (10, 20, and 30) are added to each other. Thus, the output characteristics of the entire solar cell module 1 are calculated. The calculated characteristics are indicated by dl in FIG. 2. In this manner, the output characteristics of the solar cell module 1 are obtained.

As described above, the solar cell module is divided into a plurality of areas, light illumination is performed in units of areas to measure the characteristics at the output terminal of the solar cell module, the output characteristics in units of areas are calculated by subtracting the characteristics of the bypass diodes from the measured data, and the calculated data are synthesized, thereby obtaining the output characteristics of the solar cell module. For this reason, the light source that illuminates the light-receiving surface of each divided area can have a compact structure and a small capacity. Thus, even a large-scale solar cell module which cannot be subjected to measurement due to the absence of a light illumination unit that can expose the entire surface of the module can be subjected to measurement by utilizing an existing light illumination unit since the method of this embodiment can use an existing, relatively compact light illumination unit. On the other hand, when a special light illumination unit that can expose the entire surface of a large-scale module is prepared, it requires very high cost and a very large setting space. However, in this embodiment, the measurement can be performed using an existing, relatively compact light illumination unit, and a relatively low-cost, compact light source can also be used. Of course, even when a conventional light illumination unit is used, the size and cost of a unit to be used can be further reduced, needless to say. Also, the operation point control unit need only have a small capacity and size.

Second Embodiment

Another embodiment of the present invention will be described below. A solar cell output characteristic measuring system using an output characteristic measuring method of this embodiment has the same hardware arrangement as that in the first embodiment, except for the control program of the measuring control unit 6.

The solar cell output characteristic measuring method of the second embodiment will be described below with reference to FIG. 3. The solar cell module 1 is divided into three areas, i.e., the first, second, and third areas (10, 20, and 30), as in the first embodiment.

The solar cell module 1 is set, so that the second and third areas (20 and 30) are completely shielded from light, and only the first area (10) is exposed. Light illuminates only the first area (10), the voltage and current at the output terminal of the solar cell module 1 are controlled by the operation point control unit 5, and the voltage and current values at the respective operation points are detected by the voltage detection unit 3 and the current detection unit 4. This measured data is indicated a1 in FIG. 3.

Subsequently, the solar cell module 1 is set, so that the first and third areas (10 and 30) are completely shielded from light, and only the second area (20) is exposed. Light illuminates only the second area (20), the voltage and current at the output terminal of the solar cell module 1 are controlled by the operation point control unit 5, and the voltage and current values at the respective operation points are detected by the voltage detection unit 3 and the current detection unit 4. This measured data is indicated a2 in FIG. 3.

Likewise, the solar cell module 1 is set, so that the first and second areas (10 and 20) are completely shielded from light, and only the third area (30) is exposed. Light illuminates only the third area (30), the voltage and current at the output terminal of the solar cell module 1 are controlled by the operation point control unit 5, and the voltage and current values at the respective operation points are detected by the voltage detection unit 3 and the current detection unit 4. This measured data is indicated a3 in FIG. 3.

In this manner, the output characteristics a1, a2, and a3 upon light illumination in units of areas are obtained. By adding the output characteristics a1, a2, and a3 upon light illumination in units of areas to each other, characteristics a4 shown in FIG. 3 are obtained. Since the output characteristics a1, a2, and a3 are data obtained by synthesizing the output characteristics of the photoelectric conversion elements in the illumination area and the voltage drop components across the bypass diodes in the non-illumination areas, the output characteristics a4 as the sum of them include the output characteristics of the solar cell module 1 and the synthesized value of the voltage drop components across the bypass diodes.

In this case, the number of bypass diodes in the non-illumination areas, which are energized upon light illumination in units areas, is known, and the total number of energized bypass diodes is also known. In addition, the characteristics of the individual bypass diodes are known. Therefore, characteristics for the total number of energized bypass diodes can be calculated. The characteristics are indicated by b4 in FIG. 3.

The voltage drop components across the bypass diodes can be removed by subtracting the characteristics b4 for the total number of bypass diodes energized upon measuring from the characteristics a4 as the sum of the output characteristics a1, a2, and a3, and the output characteristics of the solar cell module 1 can be calculated. The calculated characteristics are indicated by d2 in FIG. 3. In this manner, the output characteristics of the solar cell module 1 are obtained.

As described above, the solar cell module is divided into a plurality of areas, light illumination is performed in units of areas to measure the characteristics at the output terminal of the solar cell module, the output characteristics in units of areas are synthesized, and diode characteristics for a total number of bypass diodes energized upon measuring. are simultaneously subtracted from the synthesized characteristics, thereby obtaining the output characteristics of the solar cell module. For this reason, the light source that illuminates the light-receiving surface of each divided area can have a compact structure and a small capacity. Thus, even a large-scale solar cell module which cannot be subjected to measurement in a conventional apparatus due to the absence of a light illumination unit that can expose the entire surface of the module can be subjected to measurement by utilizing an existing light illumination unit since the method of this embodiment can use an existing, relatively compact light illumination unit. On the other hand, when a special light illumination unit that can expose the entire surface of a large-scale module is prepared, it requires very high cost and a very large setting space. However, in the second embodiment, the measurement can be performed using an existing, relatively compact light illumination unit, and a relatively low-cost, compact light source can also be used. Of course, even when a conventional light illumination unit is used, the size and cost of a unit to be used can be further reduced, needless to say. Also, the operation point control unit need only have a small capacity and size. The output characteristics of the solar cell module can be obtained in a smaller number of processes as compared to the first embodiment, and the calculation processes can be simplified.

Third Embodiment

Still another embodiment of the present invention will be described below. A solar cell output characteristic measuring system using an output characteristic measuring method of the third embodiment has the same hardware arrangement as those in the first and second embodiments, except for the control program of the measuring control unit 6.

The solar cell output characteristic measuring method of the third embodiment has many common portions to those in the second embodiment, and only differences from the second embodiment will be explained below.

In the second embodiment, the characteristics for the total number of bypass diodes energized are calculated on the basis of the pre-stored characteristics of the individual bypass diodes. However, in this embodiment, before, during, or after measurements of the output characteristics upon light illumination in units of areas, all the areas on the solar cell module 1 are shielded from light, and the characteristics at that time are measured. With this measurement, the characteristics upon energizing the bypass diodes in all the areas are obtained. When the output characteristics in units of areas are measured by illuminating each of the first, second, and third areas (10, 20, and 30), the bypass diodes in the second and third areas (20 and 30), the first and third areas (10 and 30), and the first and second areas (10 and 20) are energized. For this reason, after the measurements of the output characteristics upon light illumination in units of areas, the bypass diodes in the first, second, and third areas (10, 20, and 30) have been respectively energized twice. More specifically, the characteristics a4 include characteristics twice those obtained upon energizing the bypass diodes in all the areas. Characteristics obtained by synthesizing those twice the actually measured characteristics of the bypass diodes in all the areas correspond to b4 in FIG. 3.

The voltage drop components across the bypass diodes can be removed by subtracting the characteristics b4 for the total number of bypass diodes energized upon measuring based on the actually measured value from the characteristics a4, and the output characteristics of the solar cell module 1 can be calculated. The calculated characteristics are indicated by d2 in FIG. 3. In this manner, the output characteristics of the solar cell module 1 are obtained.

As described above, the solar cell module is divided into a plurality of areas, light illumination is performed in units of areas to measure the characteristics at the output terminal of the solar cell module, the output characteristics in units of areas are synthesized, and diode characteristics for the total number of bypass diodes energized upon measuring are simultaneously subtracted from the synthesized characteristics, thereby obtaining the output characteristics of the solar cell module. For this reason, the light source that illuminates the light-receiving surface of each divided area can have a compact structure and a small capacity. Thus, even a large-scale solar cell module which cannot be subjected to measurement in a conventional apparatus due to the absence of a light illumination unit that can expose the entire surface of the module can be subjected to measurement by utilizing an existing light illumination unit since the method of this embodiment can use an existing, relatively compact light illumination unit. On the other hand, when a special light illumination unit that can expose the entire surface of a large-scale module is prepared, it requires very high cost and a very large setting space. However, in the third embodiment, the measurement can be performed using an existing, relatively compact light illumination unit, and a relatively low-cost, compact light source can also be used. Of course, even when a conventional light illumination unit is used, the size and cost of a unit to be used can be further reduced, needless to say. Also, the operation point control unit need only have a small capacity and size. Furthermore, since the output characteristics are calculated based on the actually measured characteristics of the bypass diodes, the influence of variations in characteristics of the bypass diodes can be eliminated, and the output characteristics of the solar cell module can be measured more accurately.

Fourth Embodiment

Figure 4:
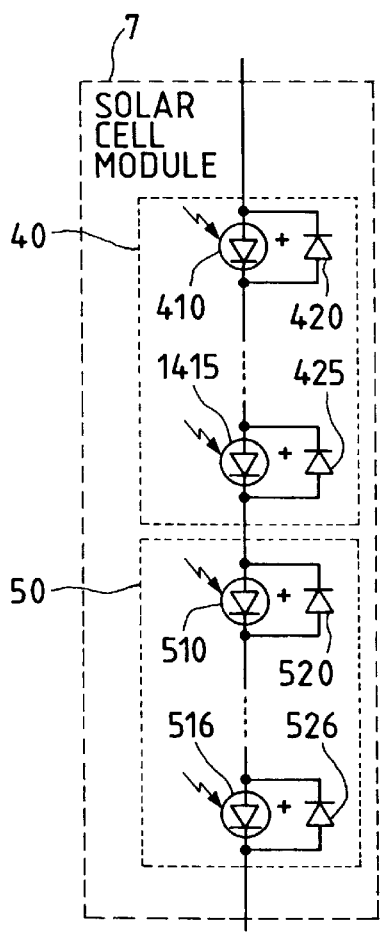
FIGS. 4 and 6 are schematic circuit diagrams showing examples of a solar cell to which the output characteristic measuring method of the present invention is applied.

Still another embodiment of the present invention will be described below. A solar cell output characteristic measuring system using an output characteristic measuring method of the third embodiment has the same hardware arrangement as those in the first, second, and third embodiments, except for the control program of the measuring control unit 6, and the division method of the solar cell module. In the first, second, and third embodiments, a series circuit of 30 parallel blocks is divided into three series block areas each including 10 parallel blocks. However, in the fourth embodiment, a solar cell module 7 has an arrangement, as shown in FIG. 4, i.e., a series block 40 in which six parallel blocks from a parallel block including a photoelectric conversion element 410 and a bypass diode 420 to a parallel block including a photoelectric conversion element 415 and a bypass diode 425 are connected in series with each other will be referred to as a fourth area (40), and a series block 50 in which seven parallel blocks from a parallel block including a photoelectric conversion element 510 and a bypass diode 520 to a parallel block including a photoelectric conversion element 516 and a bypass diode 526 are connected in series with each other will be referred to as a fifth area (50). The fourth embodiment will exemplify a case wherein the number of series-connected parallel blocks of the solar cell module 7 is unevenly divided.

The solar cell module 7 is set so that the fifth area (50) is completely shielded from light, and only the fourth area (40) is exposed. Light illuminates only the fourth area (40), the voltage and current at the output terminal of the solar cell module 7 are controlled by the operation point control unit 5, and the voltage and current values at the respective operation points are detected by the voltage detection unit 3 and the current detection unit 4. This measured data is indicated by a5 in FIG. 5.

Subsequently, the solar cell module 7 is set so that the fourth area (40) is completely shielded from light, and only the fifth area (50) is exposed. Light illuminates only the fifth area (50), the voltage and current at the output terminal of the solar cell module 7 are controlled by the operation point control unit 5, and the voltage and current values at the respective operation points are detected by the voltage detection unit 3 and the current detection unit 4. This measured data is indicated by a6 in FIG. 5. In this manner, the output characteristics a5 and a6 upon light illumination in units of areas are obtained.

Before, during, or after the measurements of the output characteristics upon light illumination in units of areas, all the areas of the solar cell module 7 are shielded from light, and the characteristics at that time are measured. Thus, the characteristics upon energizing the bypass diodes in all the areas can be obtained.

Figure 5A:
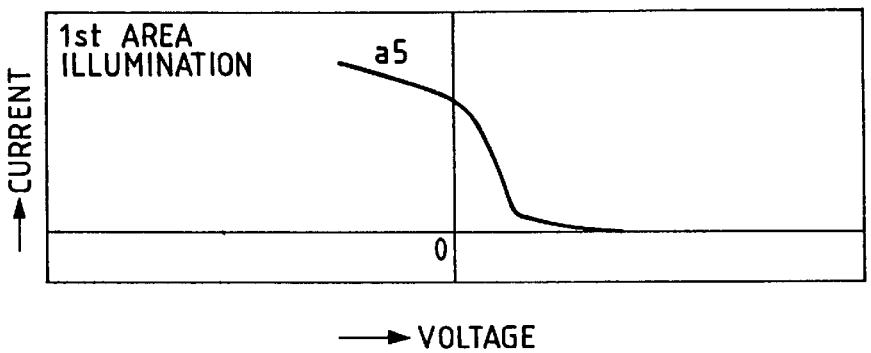
Figure 5B:
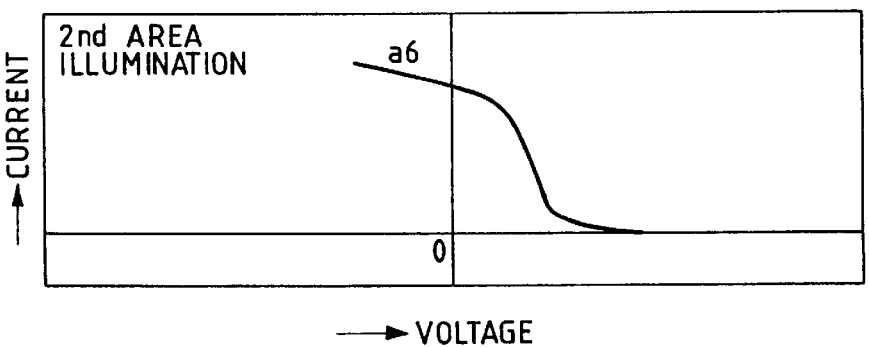
Figure 5C:
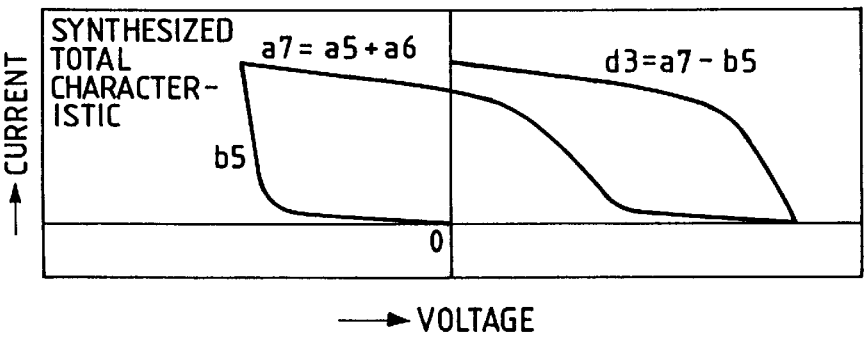

In this case, characteristics a7 in FIG. 5 are obtained by adding the output characteristics a5 and a6 upon light illumination in units of areas to each other. Since the output characteristics a5 and a6 are data obtained by synthesizing the output characteristics of the photoelectric conversion elements on the illumination area and the voltage drop components across the bypass diodes in the non-illumination area, the characteristics a7 as the sum of them include the synthesized value of the output characteristics of the solar cell module 7 and the voltage drop components across the bypass diodes. When the output characteristics in units of areas are measured by illuminating each of the fourth and fifth areas (40 and 50), the bypass diodes in the fifth and fourth areas (50 and 40) are respectively energized. Therefore, after the measurements of the output characteristics upon light illumination in units of areas, the bypass diodes in the fourth and fifth areas (40 and 50) have been respectively energized once. That is, the synthesized characteristics a7 include characteristics obtained upon energizing the bypass diodes in all the areas once. Characteristics obtained upon energizing the bypass diodes in all the areas once correspond to b5 in FIG. 5.

The voltage drop components across the bypass diodes can be removed by subtracting the characteristics b5 for the total number of bypass diodes energized upon measuring based on the actually measured value from the synthesized characteristics a7, and the output characteristics of the solar cell module 7 can be calculated. The calculated characteristics are indicated by d3 in FIG. 5. In this manner, the output characteristics of the solar cell module 7 are obtained.

As described above, the solar cell module is divided into a plurality of areas, light illumination is performed in units of areas to measure the characteristics at the output terminal of the solar cell module, the output characteristics in units of areas are synthesized, and diode characteristics for the total number of bypass diodes energized upon measuring are simultaneously subtracted from the synthesized characteristics, thereby obtaining the output characteristics of the solar cell module. For this reason, the light source that illuminates the light-receiving surface of each divided area can have a compact structure and a small capacity. Thus, even a large-scale solar cell module which cannot be subjected to measurement in a conventional apparatus due to the absence of a light illumination unit that can expose the entire surface of the module can be subjected to measurement by utilizing an existing light illumination unit since the method of this embodiment can use an existing, relatively compact light illumination unit. On the other hand, when a special light illumination unit that can expose the entire surface of a large-scale module is prepared, it requires very high cost and a very large setting space. However, in the fourth embodiment, the measurement can be performed using an existing, relatively compact light illumination unit, and a relatively low-cost, compact light source can also be used. Of course, even when a conventional light illumination unit is used, the size and cost of a unit to be used can be further reduced, needless to say. Also, the operation point control unit need only have a small capacity and size. Furthermore, since the solar cell modules can be unevenly divided into a plurality of areas, the method of this embodiment can be widely applied to various types of solar cells.

Fifth Embodiment

Figure 6:
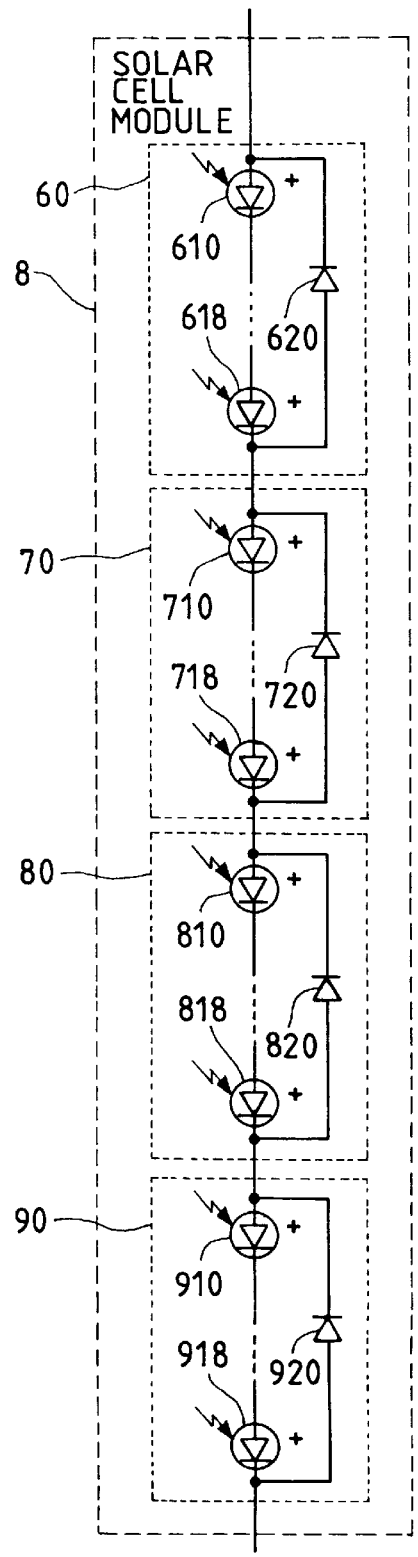

Still another embodiment of the present invention will be described below. A solar cell output characteristic measuring system using an output characteristic measuring method of the third embodiment has the same hardware arrangement as those in the first, second, third, and fourth embodiments, except for the control program of the measuring control unit 6, and the division method of the solar cell module. In the solar cell module of each of the first, second, third, and fourth embodiments, one bypass diode is connected in inverse-parallel with one photoelectric conversion element. However, in one unit 60 of a solar cell module of the fifth embodiment shown in FIG. 6, one bypass diode 620 is connected in inverse-parallel with a series circuit of nine photoelectric conversion elements 610 to 618.

A solar cell module 8 is divided into four areas, i.e., a sixth area (60) including a single series block 60 in which one bypass diode 620 is connected in inverse-parallel to a series circuit of photoelectric conversion elements 610 to 618, a seventh area (70) including a single series block 70 in which one bypass diode 720 is connected in inverse-parallel to a series circuit of photoelectric conversion elements 710 to 718, an eighth area (80) including a single series block 80 in which one bypass diode 820 is connected in inverse-parallel to a series circuit of photoelectric conversion elements 810 to 818, and a ninth area (90) including a single series block 90 in which one bypass diode 920 is connected in inverse-parallel to a series circuit of photoelectric conversion elements 910 to 918. With this solar cell module 8, the output characteristics in units of areas illuminated by light are measured in the same manner as in the first to fourth embodiments. Note that each of the sixth, seventh, eighth, and ninth areas (60, 70, 80, and 90) may be considered as a single module.

Independently of whether the bypass diode is connected to each photoelectric conversion element or some photoelectric conversion elements, the bypass diodes in the non-illumination area are energized, and voltage drop components are generated in correspondence with the number of energized bypass diodes. For this reason, the output characteristics of the solar cell module 8 can be calculated by subtracting the characteristics of the bypass diodes as in the first to fourth embodiments.

As described above, the solar cell module is divided into a plurality of areas, light illumination is performed in units of areas to measure the characteristics at the output terminal of the solar cell module, the output characteristics in units of areas are synthesized, and diode characteristics for the total number of bypass diodes energized upon measuring are simultaneously subtracted from the synthesized characteristics, thereby obtaining the output characteristics of the solar cell module. For this reason, the light source that illuminates the light-receiving surface of each divided area can have a compact structure and a small capacity. Thus, even a large-scale solar cell module which cannot be subjected to measurement in a conventional apparatus due to the absence of a light illumination unit that can expose the entire surface of the module can be subjected to measurement by utilizing an existing light illumination unit since the method of this embodiment can use an existing, relatively compact light illumination unit. On the other hand, when a special light illumination unit that can expose the entire surface of a large-scale module is prepared, it requires very high cost and a very large setting space. However, in the fifth embodiment, the measurement can be performed using an existing, relatively compact light illumination unit, and a relatively low-cost, compact light source can also be used. Of course, even when a conventional light illumination unit is used, the size and cost of a unit to be used can be further reduced, needless to say. Also, the operation point control unit need only have a small capacity and size. Furthermore, since a bypass diode may be commonly connected to a plurality of photoelectric conversion elements, the method of this embodiment can be widely applied to various types of solar cells.

As described above, according to the present invention, the following effects are obtained.

(1) The measurement of the output characteristics of a large-scale battery power supply using a solar simulator, which cannot be measured in a conventional apparatus, can be realized. Therefore, output characteristics can always be accurately measured under constant conditions.

(2) Since the light illumination area can be reduced, an existing relatively low-cost light illumination unit can be used.

(3) Since a compact light illumination unit can be used, the size of an equipment and the power supply capacity can be reduced.

(4) The output characteristics of even a solar cell that can be subjected to measurement by a conventional apparatus can be measured using a smaller, lower-cost light illumination unit.

(5) By simultaneously subtracting the bypass diode characteristics from characteristics obtained by synthesizing those in units of divided areas, the output characteristics can be calculated in a smaller number of calculation processes.

(6) Since the characteristics of a series circuit of all the bypass diodes are actually measured, and are simultaneously subtracted from characteristics obtained by synthesizing those in units of divided areas, variations in characteristics of the bypass diodes can be eliminated.

As described above, the present invention is very effective especially for the measurement of the output characteristics of a large-scale solar cell module.

When a system is constituted by combining solar cell modules having substantially equal characteristics as a result of output measurements, electric power can be output more efficiently.

Note that the present invention is not limited to the above embodiments and the drawings, and various changes and modifications may be made within the scope of the present invention.

What is claimed is:

1. A solar cell output characteristic measuring apparatus comprising:

voltage detection means for detecting an output voltage from a solar cell in which m (m≧2) parallel blocks each including a photoelectric conversion element and a bypass diode connected in inverse-parallel to the photoelectric conversion element are connected in series with each other;

current detection means for detecting an output current from the solar cell;

operation point control means, connected to an output terminal of the solar cell, for changing an operation point of the solar cell upon measuring output characteristics of the solar cell;

light illumination means for illuminating the photoelectric conversion element in a portion of the solar cell upon measuring the output characteristics;

means for dividing the solar cell into n (2≦n≦m) areas each including at least one parallel block, and measuring output characteristics of the solar cell in units of areas by illuminating the photoelectric conversion element in one area by said light illumination means and shielding the photoelectric conversion elements in other (n−1) areas from light;

means for calculating output characteristics of the individual areas by synthesizing characteristics of the bypass diodes energized upon measuring the output characteristics in units of areas; and means for calculating output characteristics of the entire solar cell by synthesizing the output characteristics of the individual areas calculated in units of areas.

2. A solar cell output characteristic measuring apparatus comprising:

voltage detection means for detecting an output voltage from a solar cell in which m (m≧2) parallel blocks each including a photoelectric conversion element and a bypass diode connected in inverse-parallel to the photoelectric conversion element are connected in series with each other;

current detection means for detecting an output current from the solar cell;

operation point control means, connected to an output terminal of the solar cell, for changing an operation point of the solar cell upon measuring output characteristics of the solar cell;

light illumination means for illuminating the photoelectric conversion element in a portion of the solar cell upon measuring the output characteristics;

means for dividing the solar cell into n (2≦n≦m) areas each including at least one parallel block, and measuring output characteristics of the solar cell in units of areas by illuminating the photoelectric conversion element in one area by said light illumination means and shielding the photoelectric conversion elements in other (n−1) areas from light;

means for synthesizing the output characteristics in units of areas; and means for calculating output characteristics of the entire solar cell by synthesizing the synthesized output characteristics and diode characteristics for a total number of bypass diodes energized upon measuring.

3. A solar cell output characteristic measuring apparatus comprising:

voltage detection means for detecting an output voltage from a solar cell in which m (m≧2) parallel blocks each including a photoelectric conversion element and a bypass diode connected in inverse-parallel to the photoelectric conversion element are connected in series with each other;

current detection means for detecting an output current from the solar cell;

operation point control means, connected to an output terminal of the solar cell, for changing an operation point of the solar cell upon measuring output characteristics of the solar cell;

light illumination means for illuminating the photoelectric conversion element in a portion of the solar cell upon measuring the output characteristics;

means for dividing the solar cell into n (2≦n≦m) areas each including at least one parallel block, and measuring output characteristics of the solar cell in units of areas by illuminating the photoelectric conversion element in one area by said light illumination means and shielding the photoelectric conversion elements in other (n−1) areas from light;

means for measuring output characteristics of the solar cell by shielding all the photoelectric conversion elements from light; and means for calculating output characteristics of the entire solar cell by synthesizing n output characteristics measured in units of areas and output characteristics corresponding to the (n−1) portions measured when all the photoelectric conversion elements are shielded from light.

4. A method for measuring characteristics of a solar cell module having a plurality of unit areas each having photoelectric conversion elements and bypass diodes connected in inverse-parallel relation with respective ones of said photoelectric conversion elements, comprising the steps of:

preliminarily measuring current-voltage characteristics of said bypass diodes;

selectively illuminating one of said unit areas and shielding the remaining unit areas;

measuring current-voltage characteristics of said solar cell module by changing an operation point of said solar cell module;

calculating current-voltage characteristics of the bypass diodes in the non-illuminated areas;

subtracting said current-voltage characteristics of the bypass diodes in the non-illuminated areas from the measured current-voltage characteristics of said solar cell module to obtain current-voltage characteristics of said single illuminated unit area; and similarly obtaining current-voltage characteristics of other ones of the unit areas, and adding all the obtained current-voltage characteristics of the unit areas, thereby obtaining current-voltage characteristics of the entire solar cell module.

5. A method for measuring characteristics of a solar cell module having a plurality of unit areas each having photoelectric conversion elements and bypass diodes connected in inverse-parallel relation with respective ones of said photoelectric conversion elements, comprising the steps of:

preliminarily measuring current-voltage characteristics of said bypass diodes;

selectively illuminating one of said unit areas and shielding the remaining unit areas;

measuring current-voltage characteristics of said solar cell module by changing an operation point of said solar cell module;

illuminating other ones of said unit areas individually, while shielding from light remaining unit areas, and measuring current-voltage characteristics of said solar cell module for each individual illumination;

summing all of the measured current-voltage characteristics of said solar cell module;

calculating total current-voltage characteristics of the bypass diodes in the non-illuminated areas; and subtracting said total current-voltage characteristics of the bypass diodes in the non-illuminated areas from the sum of all the measured current-voltage characteristics of said solar cell module, thereby obtaining current-voltage characteristics of the entire solar cell module.

6. A method for measuring characteristics of a solar cell module having n (n≧2) unit areas each having photoelectric conversion elements and bypass diodes connected in inverse-parallel relation with respective ones of said photoelectric conversion elements, comprising the steps of:

selectively illuminating one of said unit areas and shielding the remaining unit areas;

measuring current-voltage characteristics of said solar cell module by changing an operation point of said solar cell module;

illuminating other ones of said unit areas individually, while shielding from light remaining unit areas, and measuring current-voltage characteristics of said solar cell module for each individual illumination;

summing all of the measured current-voltage characteristics of said solar cell module;

measuring total current-voltage characteristics of the bypass diodes by shielding the entire surface of the solar cell module;

calculating current-voltage characteristics of the bypass diodes corresponding to (n−1) areas; and subtracting said current-voltage characteristics of the bypass diodes corresponding to (n−1) areas from the sum of all the measured current-voltage characteristics of said solar cell module, thereby obtaining current-voltage characteristics of the entire solar cell module.

* * * * *

UNITED STATES PATENT AND TRADEMARK OFFICE
CERTIFICATE OF CORRECTION

PATENT NO. : 5,955,885

DATED : September 21, 1999

INVENTOR(S): SEIJI KUROKAMI, ET AL.

It is certified that error appears in the above-identified patent and that said Letters Patent is hereby corrected as shown below:

COVER PAGE AT ITEM [56] RC:
Foreign Patent Documents: "9312710" should read --9312710.1--.

COLUMN 1:
Line 10, "measuring-the" should read --measuring the--;
Line 26, "voltage-" should read --voltage--; and
Line 39, "voltage-" should read --voltage--.

COLUMN 9:
Line 36, "expose" should read --exposes--.

COLUMN 10:
Line 31, "light," should read --light;
Line 33, "cloth;" should read --cloth,--; and
Line 55, "al" should read --a1--.

COLUMN 11:
Line 16, "a2" should read --by a2--; and
Line 46, "a3" should read --by a3--.

COLUMN 12:
Line 16, "dl" should read --d1--; and
Line 65, "al" should read --by a1--.

UNITED STATES PATENT AND TRADEMARK OFFICE
CERTIFICATE OF CORRECTION

PATENT NO. : 5,955,885

DATED : September 21, 1999

INVENTOR(S): SEIJI KUROKAMI, ET AL.

It is certified that error appears in the above-identified patent and that said Letters Patent is hereby corrected as shown below:

COLUMN 13:
Line 7, "a2" should read --by a2--;
Line 17, "a3" should read --by a3--; and
Line 52, "measuring." should read --measuring--.

Signed and Sealed this

Thirty-first Day of October, 2000

Attest:

Q. TODD DICKINSON

Attesting Officer   Director of Patents and Trademarks